United States Patent
Wada

(10) Patent No.: US 12,531,493 B2
(45) Date of Patent: Jan. 20, 2026

(54) SEMICONDUCTOR DEVICE AND POWER CONVERSION DEVICE

(71) Applicant: Mitsubishi Electric Corporation, Tokyo (JP)

(72) Inventor: Yukihiko Wada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 767 days.

(21) Appl. No.: 17/791,941

(22) PCT Filed: Mar. 6, 2020

(86) PCT No.: PCT/JP2020/009729
§ 371 (c)(1),
(2) Date: Jul. 11, 2022

(87) PCT Pub. No.: WO2021/176695
PCT Pub. Date: Sep. 10, 2021

(65) Prior Publication Data
US 2023/0052235 A1 Feb. 16, 2023

(51) Int. Cl.
*H01L 23/00* (2006.01)
*H02M 7/5387* (2007.01)

(52) U.S. Cl.
CPC .............. *H01L 24/48* (2013.01); *H01L 24/49* (2013.01); *H02M 7/53871* (2013.01);
(Continued)

(58) Field of Classification Search
CPC ......... H01L 24/48; H01L 24/49; H01L 24/05; H01L 24/06; H01L 24/32; H01L 24/73;
(Continued)

(56) References Cited

U.S. PATENT DOCUMENTS

| 2007/0296040 | A1 | 12/2007 | Tametani et al. |
| 2014/0367739 | A1* | 12/2014 | Muto ...................... H01L 24/37 |
| | | | 257/146 |

(Continued)

FOREIGN PATENT DOCUMENTS

| DE | 10159020 C1 | 3/2003 |
| DE | 102006049211 A1 | 12/2007 |

(Continued)

OTHER PUBLICATIONS

Office Action mailed Oct. 31, 2023, in German Application No. 11 2020 006 843.9, 16 pages.

(Continued)

*Primary Examiner* — Teresa M. Arroyo
(74) *Attorney, Agent, or Firm* — XSENSUS LLP

(57) ABSTRACT

In this semiconductor device, an emitter electrode of a power semiconductor element includes a first sub-electrode provided in a region including a central portion of a front surface of a semiconductor substrate and a second sub-electrode provided in a region not including the central portion of the front surface of the semiconductor substrate. A first bonding wire connects the first sub-electrode and an emitter terminal. A second bonding wire connects the second sub-electrode and the emitter terminal. First and second voltage detectors detect voltages between the emitter terminal and the first and second sub-electrodes, respectively. It is possible to separately detect degradation of both the first bonding wire that degrades in an early period and the second bonding wire that degrades in a terminal period.

20 Claims, 8 Drawing Sheets

(52) U.S. Cl.
CPC ............... *H01L 2224/48091* (2013.01); *H01L 2224/48227* (2013.01); *H01L 2224/4846* (2013.01); *H01L 2224/49113* (2013.01); *H01L 2924/13055* (2013.01)

(58) Field of Classification Search
CPC . H01L 2224/48091; H01L 2224/48227; H01L 2224/4846; H01L 2224/49113; H01L 2224/04026; H01L 2224/04042; H01L 2224/06181; H01L 2224/0603; H01L 2224/32225; H01L 2224/48472; H01L 2224/49111; H01L 2224/49175; H01L 2224/73265; H01L 2924/13055; H01L 2924/00014; H01L 23/36; H01L 23/3735; H01L 2924/00012; H01L 2224/45099; H02M 7/53871; H02M 7/003; H02M 1/327

See application file for complete search history.

(56) References Cited

U.S. PATENT DOCUMENTS

| | | | |
|---|---|---|---|
| 2019/0237448 A1* | 8/2019 | Nakashima | H02M 7/003 |
| 2020/0116780 A1 | 4/2020 | Kawahara et al. | |
| 2021/0048472 A1* | 2/2021 | Ito | H01L 25/18 |

FOREIGN PATENT DOCUMENTS

| | | | |
|---|---|---|---|
| JP | H09266226 A | * | 10/1997 |
| WO | 2018/211735 A1 | | 11/2018 |

OTHER PUBLICATIONS

International Search Report and Written Opinion mailed on Jun. 2, 2020, received for PCT Application PCT/JP2020/009729, filed on Mar. 6, 2020, 8 pages including English Translation.

* cited by examiner

SEMICONDUCTOR DEVICE AND POWER CONVERSION DEVICE

CROSS-REFERENCE TO RELATED APPLICATIONS

The present application is based on PCT filing PCT/JP2020/009729, filed Mar. 6, 2020, the entire contents of which are incorporated herein by reference.

TECHNICAL FIELD

The present disclosure relates to a semiconductor device and a power conversion device.

BACKGROUND ART

In general, in a power module, a power semiconductor element has an emitter electrode connected to an emitter terminal via a plurality of bonding wires. When being repeatedly switched on and off, the power semiconductor element is repeatedly heated and cooled, thereby causing the bonding wires to degrade due to a difference in coefficient of linear expansion between the bonding wires and the emitter electrode.

For example, WO 2018-211735 A (PTL 1) discloses a method by which an emitter electrode is divided into a plurality of sub-electrodes, each two adjacent sub-electrodes are connected by a resistance part, each sub-electrode and an emitter terminal are connected by a plurality of bonding wires, and when a voltage between any one of the sub-electrodes and the emitter terminal exceeds a threshold voltage, it is determined that the bonding wires have degraded.

CITATION LIST

Patent Literature

PTL 1: WO 2018-211735 A

SUMMARY OF INVENTION

Technical Problem

As disclosed in PTL 1, it is, however, not possible to accurately determine whether the power module in its entirety is in an early stage of degradation or in a terminal stage of degradation on the basis of a result of separately detecting degradation of both a wire that degrades in an early period and a wire that degrades in a terminal period among the plurality of bonding wires.

It is therefore a main object of the present disclosure to provide a semiconductor device capable of separately detecting degradation of both a bonding wire that degrades in an early period and a bonding wire that degrades in a terminal period, and a power conversion device using the semiconductor device.

Solution to Problem

A semiconductor device of the present disclosure includes: a semiconductor element including a semiconductor substrate, a first electrode, a second electrode, and a control electrode, and causing a current having a value corresponding to a voltage applied to the control electrode to flow from the first electrode to the second electrode; a first terminal; and a plurality of bonding wires connecting the second electrode and the first terminal. The second electrode is divided into a plurality of sub-electrodes, and the plurality of sub-electrodes includes a first sub-electrode provided in a first region including a central portion of a front surface of the semiconductor substrate, and a second sub-electrode provided in a second region not including the central portion of the front surface of the semiconductor substrate. The plurality of bonding wires includes a first bonding wire connecting the first sub-electrode and the first terminal, and a second bonding wire connecting the second sub-electrode and the first terminal. This semiconductor device further includes a first voltage detector to detect a voltage between the first sub-electrode and the first terminal, and a second voltage detector to detect a voltage between the second sub-electrode and the first terminal.

Advantageous Effects of Invention

In this semiconductor device, the first sub-electrode is higher in temperature than the second sub-electrode, so that the first bonding wire connected to the first sub-electrode degrades in an early period, and the second bonding wire connected to the second sub-electrode degrades in a terminal period. Further, degradation of the first bonding wire causes an increase in voltage at the first sub-electrode, and degradation of the second bonding wire causes an increase in voltage at the second sub-electrode. It is therefore possible to separately detect, on the basis of the detection results of the first and second voltage detectors, degradation of both the first bonding wire that degrades in an early period and the second bonding wire that degrades in a terminal period.

DESCRIPTION OF EMBODIMENTS

First Embodiment

Figure 1:
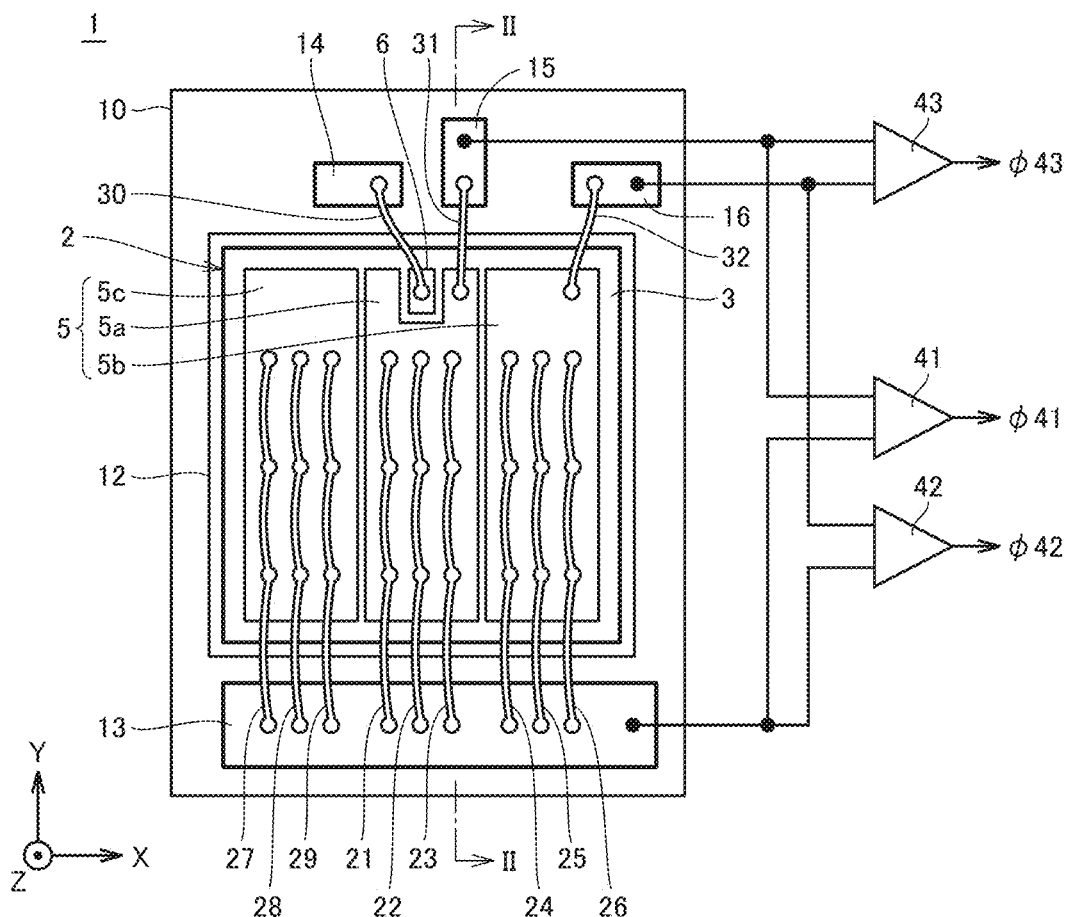
FIG. 1 is a diagram illustrating a configuration of a semiconductor device according to a first embodiment.
Figure 2:
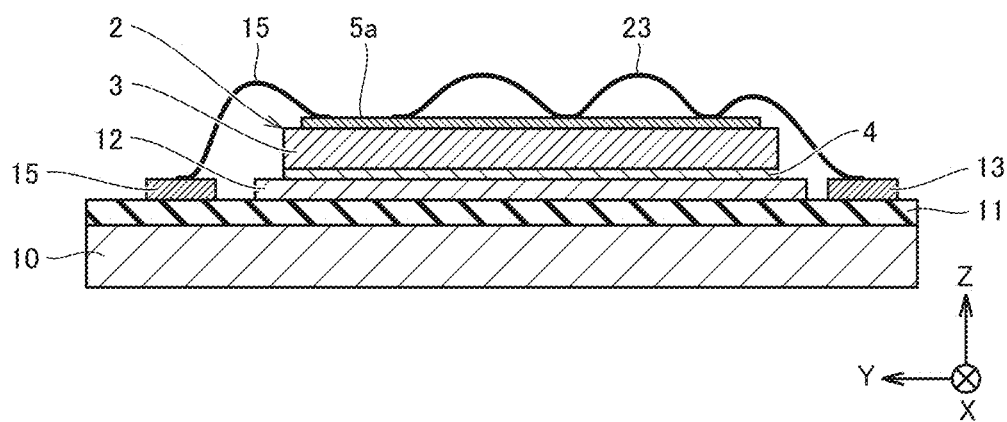
FIG. 2 is a cross-sectional view taken along a line II-II in FIG. 1.

FIG. 1 is a diagram illustrating a configuration of a semiconductor device 1 according to the first embodiment. FIG. 2 is a cross-sectional view taken along a line II-II in FIG. 1. In FIGS. 1 and 2, a semiconductor device 1 includes a power semiconductor element 2.

Power semiconductor element 2 is, for example, an insulated gate bipolar transistor (IGBT), and includes a semiconductor substrate 3, a collector electrode 4 (first electrode), an emitter electrode 5 (second electrode), and a gate electrode 6 (control electrode). In power semiconductor element 2, a current having a value corresponding to a voltage applied to gate electrode 6 flows from collector electrode 4 to emitter electrode 5.

Semiconductor substrate 3 is formed in a rectangular shape. A front surface of semiconductor substrate 3 has sides extending in an X direction in the drawing and sides extending in a Y direction in the drawing. A thickness direction of semiconductor substrate 3 coincides with a Z direction in the drawing. Collector electrode 4 is provided all over a back surface of semiconductor substrate 3.

Emitter electrode 5 and gate electrode 6 are provided on the front surface of semiconductor substrate 3. Emitter electrode 5 is divided into three sub-electrodes 5a, 5b, and 5c. Sub-electrodes 5a to 5c are each formed in a rectangular shape and have long sides extending in the Y direction in the drawing. Sub-electrode 5a (first sub-electrode) is disposed at a center of the front surface of semiconductor substrate 3, sub-electrode 5b (second sub-electrode) is disposed adjacent to one side (right side in the drawing) of sub-electrode 5a, and sub-electrode 5c is disposed adjacent to the other side (left side in the drawing) of sub-electrode 5a.

In other words, the front surface of semiconductor substrate 3 is divided into first to third regions. The first region is a region including a central portion of the front surface of semiconductor substrate 3. The second region is a region not including the central portion of the front surface of semiconductor substrate 3 and adjacent to one side (the right side in the drawing) of the first region. The third region is a region adjacent to the other side (left side in the drawing) of the first region. The third region may or may not include the central portion of the front surface of semiconductor substrate 3.

Gate electrode 6 is provided over a central portion of an upper end of the first region in the drawing, and the sub-electrode 5a is provided over the remaining portion of the first region. Sub-electrode 5b is provided over the second region, and sub-electrode 5c is provided over the third region.

Emitter electrode 5 contains aluminum, an aluminum silicon alloy (AlSi), or gold (Au). In order to prevent emitter electrode 5 from degrading due to changes in temperature of power semiconductor element 2, a metal film of nickel (Ni), copper, or the like may be further provided on emitter electrode 5 by plating, vapor deposition, or sputtering.

Semiconductor device 1 further includes a metal base plate 10 and a plurality of bonding wires 21 to 32. Base plate 10 is formed in a rectangular shape larger than semiconductor substrate 3. On a front surface of base plate 10, an insulating layer 11 is provided, and on a front surface of insulating layer 11, a collector terminal 12, an emitter terminal 13, a gate terminal 14, and monitor terminals 15 and 16 are provided. Terminals 12 to 16 are each made of a metal material such as copper (Cu) or aluminum (Al).

Collector terminal 12 is formed in a rectangular shape larger than semiconductor substrate 3, and is disposed in a central portion of base plate 10 when viewed from above. Power semiconductor element 2 is disposed in a central portion of a front surface of collector terminal 12, and collector electrode 4 is bonded to the central portion of the front surface of collector terminal 12 by a conductive adhesive (not illustrated). The conductive adhesive is, for example, solder, sintered silver, or the like.

Emitter terminal 13 (first terminal) is formed in a band shape extending in the X direction in the drawing, and is disposed along a lower side of collector terminal 12 in the drawing. Bonding wires 21 to 23 connect sub-electrode 5a and a central portion of emitter terminal 13. Bonding wires 24 to 26 connect sub-electrode 5b and one end (right end in the drawing) of emitter terminal 13. Bonding wires 27 to 29 connect sub-electrode 5c and the other end (left end in the drawing) of emitter terminal 13.

Bonding wires 21 to 29 each extend in the Y direction in the drawing when viewed from above. Bonding wires 21 to 23 are bonded to a plurality of points (three points in the drawing) on a front surface of sub-electrode 5a and bonded to a front surface of emitter terminal 13. Bonding wires 24 to 26 are bonded to a plurality of points (three points in the drawing) on a front surface of sub-electrode 5b and bonded to the front surface of emitter terminal 13. Bonding wires 27 to 29 are bonded to a plurality of points (three points in the drawing) on a front surface of sub-electrode 5c and bonded to the front surface of emitter terminal 13.

Examples of a method for bonding a bonding wire to a front surface of an electrode include a method by which ultrasonic waves are applied to the bonding wire while the bonding wire is pressed against the front surface of the electrode. This causes the bonding wire to be mechanically and electrically connected to the electrode.

Gate terminal 14 is formed in a rectangular shape, and is disposed, in the vicinity of gate electrode 6, along an upper side of collector terminal 12 in the drawing. Long sides of gate terminal 14 extend in the X direction in the drawing. Bonding wire 30 is bonded to a front surface of gate electrode 6 and bonded to a front surface of gate terminal 14 to connect gate electrode 6 and gate terminal 14.

Monitor terminal 15 (second terminal) is formed in a rectangular shape, and is disposed, in the vicinity of sub-electrode 5a, along the upper side of collector terminal 12 in the drawing. Short sides of monitor terminal 15 extend in the X direction in the drawing. Bonding wire 31 is bonded to the front surface of sub-electrode 5a and bonded to a front surface of monitor terminal 15 to connect sub-electrode 5a and monitor terminal 15.

Monitor terminal 16 (third terminal) is formed in a rectangular shape, and is disposed, in the vicinity of sub-electrode 5b, along the upper side of collector terminal 12 in the drawing. Long sides of monitor terminal 16 extend in the X direction in the drawing. Bonding wire 32 is bonded to the front surface of sub-electrode 5b and bonded to a front surface of monitor terminal 16 to connect sub-electrode 5b and monitor terminal 16.

Semiconductor device 1 further includes voltage detectors 41 to 43. Voltage detector 41 detects a voltage Va between monitor terminal 15 and emitter terminal 13, and outputs a signal φ41 indicating the detection value. Signal φ41 is used to determine a degree of degradation of bonding wires 21 to 23 that degrade in an early period.

Voltage detector 42 detects a voltage Vb between monitor terminal 16 and emitter terminal 13, and outputs a signal φ42 indicating the detection value. Signal φ42 is used to determine a degree of degradation of bonding wires 24 to 26 that degrade in a terminal period. Further, signals φ41, φ42 are used to determine a degree of degradation of entire semiconductor device 1.

Voltage detector 43 detects a voltage Vc between monitor terminal 15 and monitor terminal 16, and outputs a signal φ43 indicating the detection value. The signal φ43 is used to detect a temperature T of power semiconductor element 2.

Further, power semiconductor element 2, bonding wires 21 to 32, and the like are encapsulated in silicone gel or epoxy resin in order to protect and insulate such components.

Note that semiconductor device 1 may be regarded in its entirety as a power module, or only base plate 10 and components mounted on base plate 10 of semiconductor device 1 may be regarded as a power module, and voltage detectors 41 to 43 may be provided outside the power module.

Figure 3:
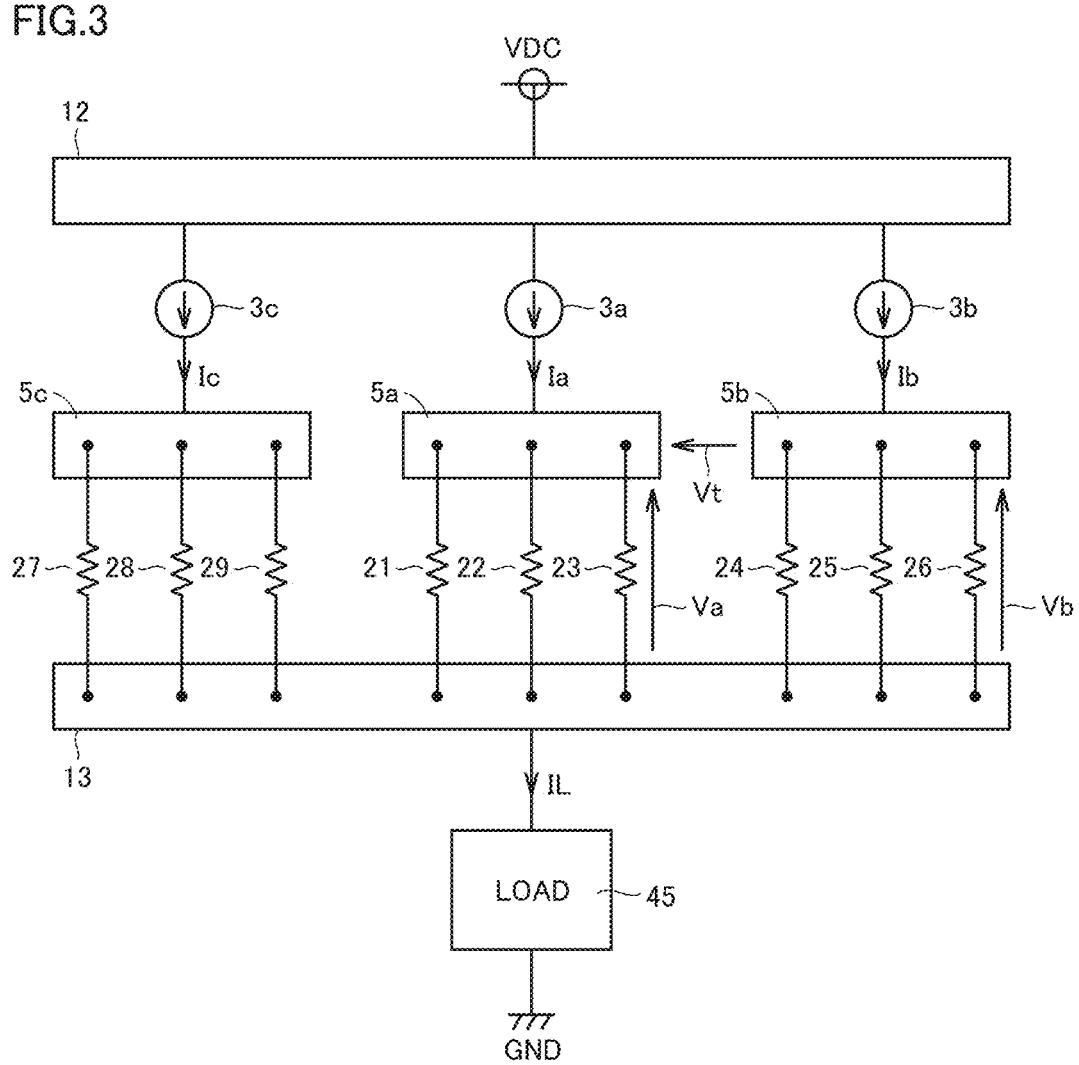
FIG. 3 is a circuit diagram for describing a method for detecting a degree of degradation of bonding wires illustrated in FIG. 1.

FIG. 3 is a circuit diagram for describing a method for detecting the degree of degradation of bonding wires 21 to 26. In FIG. 3, bonding wires 21 to 29 are each denoted by a symbol indicating a resistor element. Further, current sources 3a to 3c correspond to portions of semiconductor substrate 3 between collector electrode 4 and sub-electrodes 5a to 5c, and flow constant currents Ia to Ic from collector electrode 4 to sub-electrodes 5a to 5c, respectively, when power semiconductor element 2 is switched on.

Collector terminal 12 is connected to a line of a DC voltage VDC, and emitter terminal 13 is connected to a line of a ground voltage GND via a load 45. Current sources 3a to 3c have one terminals connected to collector terminal 12 and the other terminals connected to sub-electrodes 5a to 5c, respectively. Bonding wires 21 to 23 are connected between sub-electrode 5a and emitter terminal 13, bonding wires 24 to 26 are connected between sub-electrode 5b and emitter terminal 13, and bonding wires 27 to 29 are connected between sub-electrode 5c and emitter terminal 13. The sum of currents Ia to Ic flowing through current sources 3a to 3c becomes a current IL flowing through load 45.

When semiconductor device 1 is new, a joint between bonding wires 21 to 29 and sub-electrodes 5a to 5c has no degradation. When power semiconductor element 2 is repeatedly switched on and off, the joint between bonding wires 21 to 29 and sub-electrodes 5a to 5c gradually degrades.

Sub-electrode 5a provided in the first region including the central portion of the front surface of semiconductor substrate 3 is higher in temperature than sub-electrode 5b provided in the second region not including the central portion of the front surface of semiconductor substrate 3. This causes the joint between bonding wires 21 to 23 and sub-electrode 5a to degrade faster than the joint between bonding wire 24 to 26 and sub-electrode 5b. This point will be described in detail later.

Assuming a resistance value of each of bonding wires 21 to 29 is denoted by R, and semiconductor device 1 is new, voltage Va between sub-electrode 5a and emitter terminal 13 is expressed by Va=Ia*R/3, a product of current Ia flowing from collector terminal 12 into sub-electrode 5a through current source 3a and a resistance value (R/3) of a parallel connector of three bonding wires 21 to 23.

Further, voltage Vb between sub-electrode 5b and emitter terminal 13 is expressed by Vb=Ib*R/3, a product of current Ib flowing from collector terminal 12 into sub-electrode 5b through current source 3b and a resistance value (R/3) of a parallel connector of three bonding wires 24 to 26.

When power semiconductor element 2 is repeatedly switched on and off, the joint between bonding wires 21 to 23 and sub-electrode 5a degrades first. For example, when bonding wire 21 degrades and separates from sub-electrode 5a, voltage Va is expressed by Va=Ia*R/2, a product of current Ia and a resistance value (R/2) of a parallel connector of two bonding wires 22, 23. Further, when two bonding wires 21, 22 degrade and separate, voltage Va is expressed by Va=Ia*R, a product of current Ia and resistance value R of one bonding wire 23.

That is, when bonding wire 21 separates, voltage Va increases from Ia*R/3 to Ia*R/2, and when bonding wire 22 additionally separates, voltage Va increases from Ia*R/2 to Ia*R. It is therefore possible to determine a degree of degradation of the joint between bonding wires 21 to 23 and sub-electrode 5a on the basis of output signal φ41 of voltage detector 41.

When power semiconductor element 2 is further repeatedly switched on and off, the joint between bonding wires 24 to 26 and sub-electrode 5b degrades. For example, when bonding wire 24 degrades and separates, voltage Vb is expressed by Vb=Ib*R/2, a product of current Ib and resistance value (R/2) of a parallel connector of two bonding wires 25, 26. Further, when two bonding wires 24 and 25 degrade and separate, voltage Vb is expressed by Vb=Ib*R, a product of current Ib and resistance value R of one bonding wire 26.

That is, when bonding wire 24 separates, voltage Vb increases from Ib*R/3 to Ib*R/2, and when bonding wire 25 additionally separates, voltage Vb increases from Ib*R/2 to Ib*R. It is therefore possible to determine a degree of degradation of the joint between bonding wires 24 to 26 and sub-electrode 5b on the basis of output signal φ42 of voltage detector 42.

Next, the reason why the joint between bonding wires 21 to 23 and sub-electrode 5a degrades faster than the joint between bonding wires 24 to 26 and sub-electrode 5b will be described in detail. When an inactive level voltage (for example, 0 V) is applied between gate terminal 14 and emitter terminal 13, power semiconductor element 2 is set into an OFF state (high resistance state), and no current flows between collector terminal 12 and emitter terminal 13.

When an active level voltage (for example, 15 V) is applied between gate terminal 14 and emitter terminal 13, power semiconductor element 2 is set into an ON state (low resistance state), and a current flows from collector terminal 12 to emitter terminal 13 through collector electrode 4, semiconductor substrate 3, emitter electrode 5, and bonding wires 21 to 29.

In general, power semiconductor element 2 is switched at a high frequency of several kHz or higher, and is switched between the ON state and the OFF state. When power semiconductor element 2 is set into the ON state, heat is generated by the current flowing between collector electrode 4 and emitter electrode 5, thereby causing power semiconductor element 2 to expand due to an increase in temperature. On the other hand, when power semiconductor element 2 is set into the OFF state, no heat is generated because no current flows, thereby causing power semiconductor element 2 to contract due to a decrease in temperature.

When power semiconductor element 2 is repeatedly switched on and off, and repeatedly expands and contracts accordingly, distortion repeatedly occurs between power semiconductor element 2 and members connected to power semiconductor element 2. A portion where the largest distortion occurs is the joint between sub-electrodes 5a to 5c and bonding wires 21 to 29 that is a portion where a large current is concentrated in a small area.

Intermittent distortion causes the joint between the sub-electrode and the bonding wire to gradually degrade. In the early stage of degradation, a crack is generated in the joint and becomes larger and larger, and finally, the bonding wire separates or disconnects from the sub-electrode.

For example, when bonding wire 21 completely separates from sub-electrode 5a, no current flows through bonding wire 21, so that a current flowing through other bonding wires 22, 23 increases, and degradation of other bonding wires 22, 23 accelerates.

For example, when no current flows through bonding wire 21 and a current flowing through other bonding wires 22, 23 increases, voltage Va between sub-electrode 5a and emitter terminal 13 rapidly increases (jumps). Detecting an increase in voltage Va makes it possible to detect the degree of degradation of bonding wires 21 to 23. Similarly, detecting an increase in voltage Vb makes it possible to detect the degree of degradation of bonding wires 24 to 26.

In general, the area of power semiconductor element 2 is considerably large, so that the central portion of power semiconductor element 2 is different in cooling efficiency and temperature from the peripheral portion of power semiconductor element 2. Collector electrode 4 (FIG. 2) of power semiconductor element 2 is bonded to the front surface of collector terminal 12 by a conductive adhesive, collector terminal 12 is provided on the front surface of base plate 10 with insulating layer 11 interposed between collector terminal 12 and base plate 10, and base plate 10 is coupled to a cooler (not illustrated).

The periphery of the central portion of a power semiconductor also generates heat, whereas there is no heating element outside the peripheral portion of power semiconductor element 2. This makes, even when the cooler uniformly applies cooling power to all of the back surface of power semiconductor element 2, the central portion of power semiconductor element 2 lower in cooling performance than the peripheral portion of power semiconductor element 2.

Therefore, the central portion of power semiconductor element 2 is higher in temperature than the peripheral portion of power semiconductor element 2. The higher the temperature, the faster the joint between the bonding wire and the sub-electrode degrades. Therefore, bonding wires 21 to 23 connected to the central portion of power semiconductor element 2 separate earlier than bonding wires 24 to 26 connected to the peripheral portion of power semiconductor element 2. That is, of bonding wires 21 to 29, bonding wires 21 to 23 degrade in an early period, and bonding wires 24 to 26 degrade in a terminal period.

Next, a description will be given of a method for detecting temperature T of power semiconductor element 2. Voltage detector 43 (FIG. 1) detects a voltage Vt between monitor terminals 15 and 16, that is, voltage Vt=Va−Vb between sub-electrodes 5a and 5b. When power semiconductor element 2 is set into the ON state, voltage Vt is generated between sub-electrodes 5a and 5b. Voltage Vt is generated because a current distribution exists between collector electrode 4 and emitter electrode 5 (that is, sub-electrodes 5a to 5c). Therefore, even when power semiconductor element 2 is new, voltage Vt is generated.

When power semiconductor element 2 is intermittently switched on and off, voltage Vt also changes intermittently. Voltage Vt when power semiconductor element 2 is switched on changes in a manner that depends on temperature T of power semiconductor element 2. When any one of bonding wires 21 to 26 separates, voltage Vt shows a rapid and continuous change (jump), but unless the bonding wire separates, voltage Vt reflects temperature T of power semiconductor element 2.

Therefore, when voltage Vt is repeatedly and continuously measured, a change in temperature T of power semiconductor element 2 can be measured. The change in temperature T of power semiconductor element 2 reflects a change in performance of the cooler coupled to a back surface of base plate 10 (FIG. 1), or reflects degradation of solder or sintered silver used for bonding collector electrode 4 and collector terminal 12 together. Therefore, when voltage Vt is repeatedly and continuously measured, it is also possible to estimate degradation of the performance of the cooler that cools semiconductor device 1.

When voltage Vt is repeatedly and continuously measured, it is also possible to detect that voltage Vt shows a continuous change (jump) due to the separation of the bonding wire. When such a continuous change (jump) in voltage Vt is detected, resetting a relationship between voltage Vt and temperature T of power semiconductor element 2 allows continuous measurement of a change in temperature. That is, assuming that temperature T is the same before and after the jump, the measurement may be continued with previous voltage Vt replaced with new voltage Vt. It is therefore necessary to measure voltage Vt repeatedly at some high frequency, but the measurement frequency only needs to be faster than a rate at which temperature T changes under the same condition, and may be every fraction of a second to every several seconds in general.

Since voltage Vt reflects temperature dependence of the material of emitter electrode 5, that is, a resistance value of the metal (aluminum, copper, or the like), voltage Vt shows a linear correlation with temperature T, and the temperature coefficient is also known, correction after the jump can be easily made.

Further, a large current does not flow through bonding wires 31 and 32 connected to monitor terminals 15 and 16, so that bonding wires 31 and 32 degrade very slowly compared to bonding wires 21 to 29. This allows the measurement to be continued with high reliability until the terminal stage of degradation of semiconductor device 1. Moreover, since the temperature of emitter electrode 5 provided on the front surface of power semiconductor element 2 is reflected rather than by a separate temperature sensor attached to the substrate inside semiconductor device 1, that is, the temperature itself of power semiconductor element 2 is measured, it is possible to accurately understand a load condition of power semiconductor element 2.

As described above, in the first embodiment, it is possible to separately determine the degree of degradation of bonding wires 21 to 23 that degrade in an early period and the degree of degradation of bonding wires 24 to 26 that degrade in a terminal period, on the basis of the detection results of voltage detectors 41, 42. It is further possible to accurately determine, on the basis of the determination result, to what extent semiconductor device 1 has degraded in its entirety, and it is also possible to accurately estimate the remaining life of semiconductor device 1.

It is also possible to measure, on the basis of the detection result of voltage detector 43, temperature T of power semiconductor element 2. Therefore, the degradation of cooling performance with respect to semiconductor device 1 and the load condition of power semiconductor element 2 can be accurately detected.

Note that power semiconductor element 2 may be a semiconductor element other than the IGBT, and may be, for example, a metal-oxide-semiconductor field effect transistor (MOSFET), a bipolar junction transistor (BJT), a gate turn-off thyristor (GTO), or a gate commutated turn-off thyristor (GCT). For example, for the MOSFET, an electrode connected to a positive electrode of a DC power supply is a drain electrode, and an electrode connected to a negative electrode is a source electrode.

Second Embodiment

In the first embodiment, monitor terminals 15 and 16 are connected to the upper ends of sub-electrodes 5a and 5b in FIG. 1, respectively, voltage detector 43 detects voltage Vt=Va−Vb between monitor terminals 15 and 16, and temperature T of power semiconductor element 2 is detected on the basis of the detection result of voltage detector 43. However, voltage Vt between monitor terminals 15 and 16 is small, which may make the detection accuracy of temperature T lower. In the second embodiment, this problem is solved.

Figure 4:
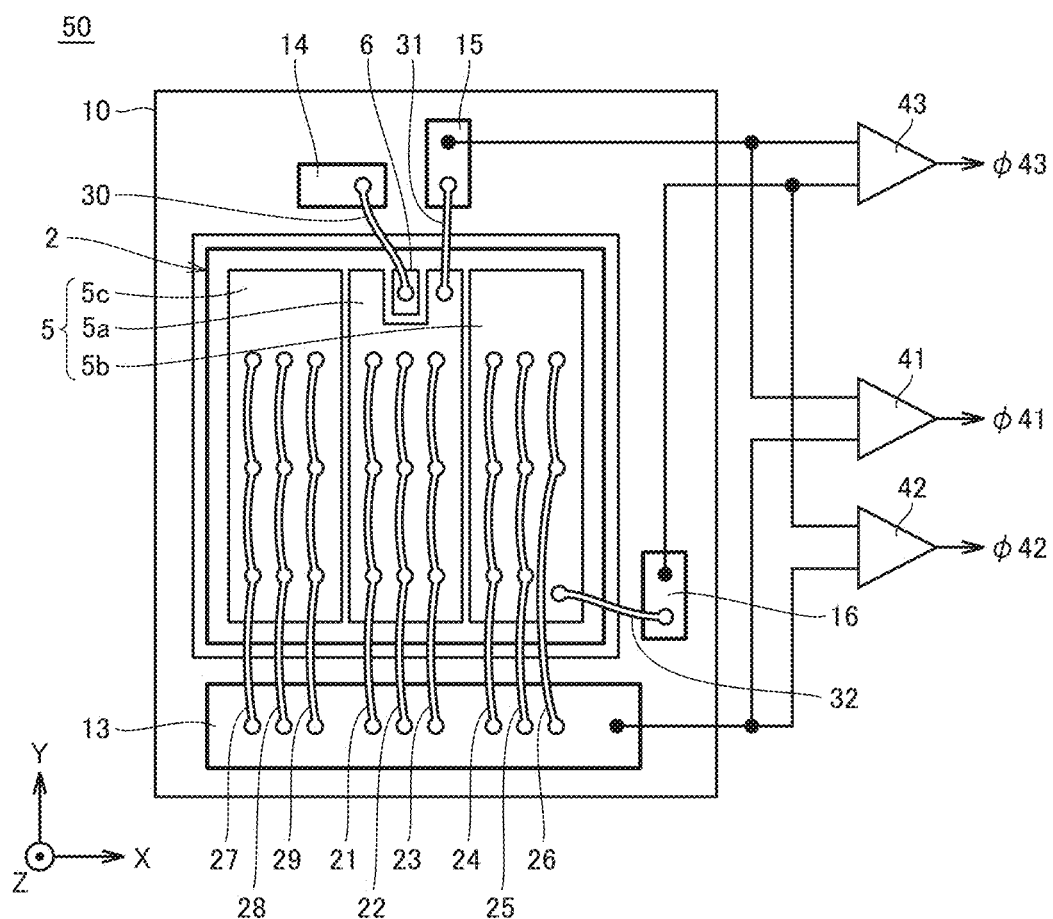
FIG. 4 is a diagram illustrating a configuration of a semiconductor device according to a second embodiment.

FIG. 4 is a diagram illustrating a configuration of a semiconductor device 50 according to the second embodiment and is a diagram to be compared with FIG. 1. With reference to FIG. 4, semiconductor device 50 differs from semiconductor device 1 in the position of monitor terminal 16. That is, in semiconductor device 1, monitor terminal 16 is disposed along the right end of the upper side of collector terminal 12 in the drawing, and is connected to the upper end of sub-electrode 5b in the drawing by bonding wire 32.

On the other hand, in semiconductor device 50, monitor terminal 16 is disposed along the lower end of the right side of collector terminal 12 in the drawing, and is connected to the lower end of sub-electrode 5b in the drawing by bonding wire 32.

Next, the reason will be described. In semiconductor devices 1 and 50, when power semiconductor element 2 is switched on, the main current of power semiconductor element 2 flows from collector electrode 4 (FIG. 2) into the back surface of semiconductor substrate 3, flows in the thickness direction (Z direction) of semiconductor substrate 3, flows out to the front surface of semiconductor substrate 3, and then flows through sub-electrodes 5a to 5c and bonding wires 21 to 29 from the upper side to the lower side in the drawing. Therefore, a voltage drop ΔVa occurs between the upper end and the lower end of sub-electrode 5a, and a voltage drop ΔVb occurs between the upper end and the lower end of sub-electrode 5b.

Therefore, the detection value of voltage Vt is larger by ΔVb when voltage Vt between the upper end of sub-electrode 5a and the lower end of sub-electrode 5b is detected than when voltage Vt between the upper end of sub-electrode 5a and the upper end of sub-electrode 5b is detected. Therefore, in the second embodiment, voltage Vt between the upper end of sub-electrode 5a and the lower end of sub-electrode 5b is detected.

As described above, in the second embodiment, since voltage detector 43 detects voltage Vt between the upper end of sub-electrode 5a and the lower end of sub-electrode 5b, a large voltage Vt can be detected as compared with the first embodiment, and the detection accuracy of temperature T of power semiconductor element 2 can be made higher accordingly.

Note that, in the second embodiment, voltage Vt between the upper end of sub-electrode 5a and the lower end of sub-electrode 5b is detected, but the detection method is not limited to such a method. Voltage Vt between a first position, which is separated from one end of sub-electrode 5a by a first distance, and a second position, which is separated from one end of sub-electrode 5b by a second distance different from the first distance, may be detected.

Third Embodiment

Figure 5:
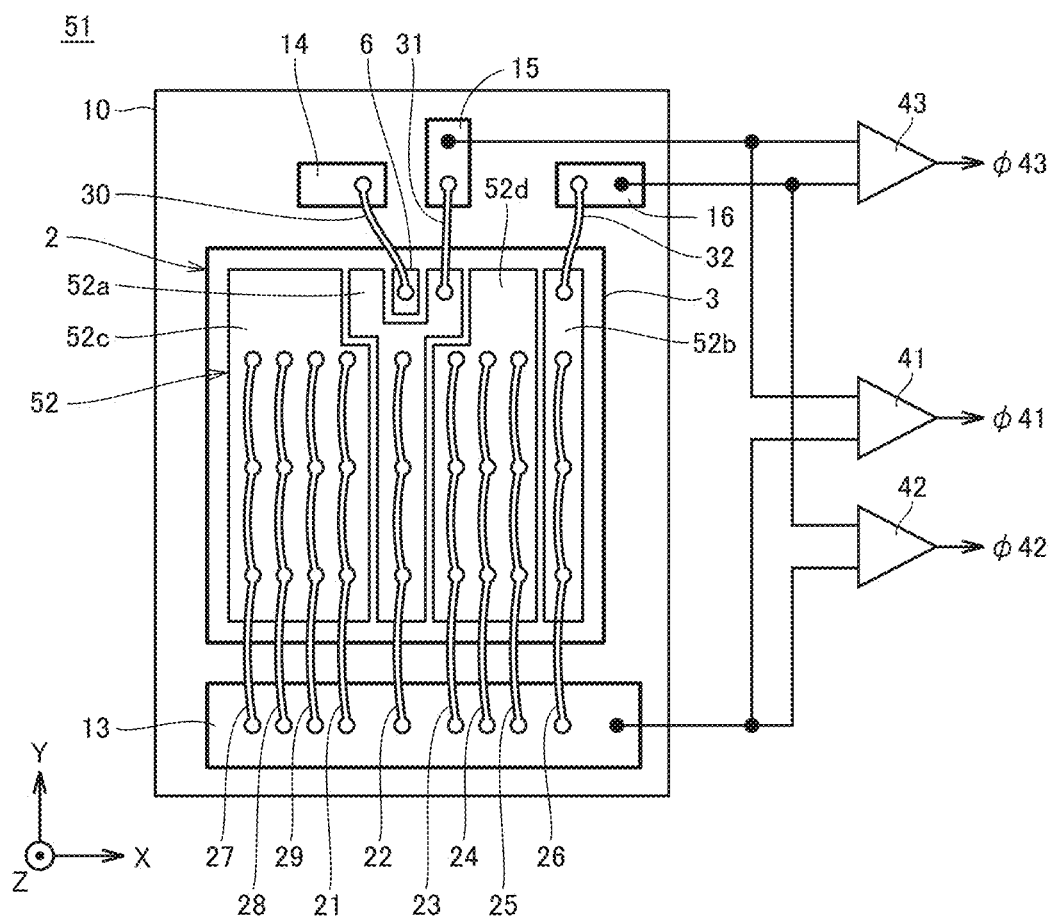
FIG. 5 is a diagram illustrating a configuration of a semiconductor device according to a third embodiment.

FIG. 5 is a diagram illustrating a configuration of a semiconductor device 51 according to the third embodiment and is a diagram to be compared with FIG. 1. With reference to FIG. 5, semiconductor device 51 is different from semiconductor device 1 in that emitter electrode 5 is replaced with an emitter electrode 52.

Emitter electrode 52 is divided into four sub-electrodes 52a, 52b, 52c, and 52d. Sub-electrode 52a is obtained by reducing a width of a portion, other than the upper end in the drawing, of sub-electrode 5a (FIG. 1), and is connected to emitter terminal 13 only by central bonding wire 22 among three bonding wires 21 to 23. Sub-electrode 52a is provided in a first region including the central portion of the front surface of semiconductor substrate 3. An upper end of sub-electrode 52a is connected to monitor terminal 15 by bonding wire 31.

Sub-electrode 52b is obtained by reducing a width of sub-electrode 5b (FIG. 1), and is connected to emitter terminal 13 only by right bonding wire 26 among three bonding wires 24 to 26 in the drawing. Sub-electrode 52b is provided in a second region not including the central portion of the front surface of semiconductor substrate 3. An upper end of sub-electrode 52b is connected to monitor terminal 16 by bonding wire 32.

Sub-electrode 52c is obtained by increasing a width of a portion, other than the upper end in the drawing, of sub-electrode 5c (FIG. 1), and is connected to emitter terminal 13 by four bonding wires 21, 27 to 29. Sub-electrode 52c is provided in a third region different from the first and second regions. The third region may or may not include the central portion of the front surface of semiconductor substrate 3.

Sub-electrode 52d is provided between sub-electrode 52a and sub-electrode 52b, and is connected to emitter terminal 13 by three bonding wires 23 to 25. Sub-electrode 52d is provided in a fourth region between the first region and the second region. The fourth region may or may not include the central portion of the front surface of semiconductor substrate 3.

In the third embodiment, since sub-electrode 52a and emitter terminal 13 are connected by only one bonding wire 22, the influence of degradation of bonding wire 22 on voltage Va between sub-electrode 52a and emitter terminal 13 is larger as compared with the case where sub-electrode 52a and emitter terminal 13 are connected by a plurality of bonding wires. This allows, as compared with the first embodiment, the degradation of bonding wire 22 that degrades in an early period to be accurately detected.

Similarly, in the third embodiment, since sub-electrode 52b and emitter terminal 13 are connected by only one bonding wire 26, the influence of degradation of bonding wire 26 on voltage Vb between sub-electrode 52b and emitter terminal 13 is larger as compared with the case where sub-electrode 52b and emitter terminal 13 are connected by a plurality of bonding wires. This allows, as compared with the first embodiment, the degradation of bonding wire 26 that degrades in a terminal period to be accurately detected.

Further, since the degradation of bonding wire 22 that degrades in an early period and the degradation of bonding wire 26 that degrades in a terminal period can be accurately detected, it is possible to accurately detect degradation of entire semiconductor device 51 and accurately estimate the remaining life of semiconductor device 51.

Note that with an extremely large number of bonding wires connecting emitter electrode 52 and emitter terminal 13, even when the number of bonding wires connecting each of sub-electrodes 52a and 52b and emitter terminal 13 is larger than one, the same effect as of the third embodiment can be obtained.

Fourth Embodiment

Figure 6:
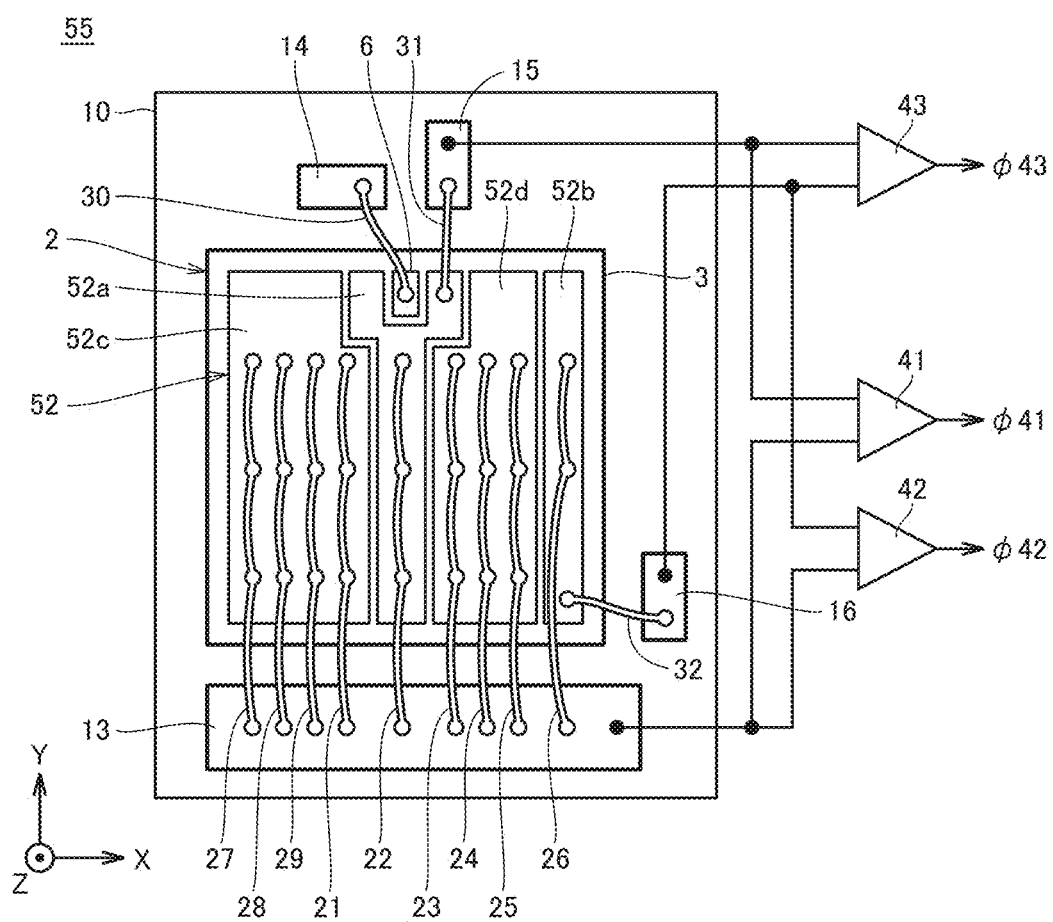
FIG. 6 is a diagram illustrating a configuration of a semiconductor device according to a fourth embodiment.

FIG. 6 is a diagram illustrating a configuration of a semiconductor device 55 according to the fourth embodiment and is a diagram to be compared with FIG. 5. With reference to FIG. 6, semiconductor device 55 differs from semiconductor device 51 in the position of monitor terminal 16. That is, in semiconductor device 51, monitor terminal 16 is disposed along the right end of the upper side of collector terminal 12 in the drawing, and is connected to the upper end of sub-electrode 52b in the drawing by bonding wire 32.

On the other hand, in semiconductor device 55, monitor terminal 16 is disposed along the lower end of the right side of collector terminal 12 in the drawing, and is connected to the lower end of sub-electrode 52b in the drawing by bonding wire 32. That is, the fourth embodiment corresponds to a combination of the second embodiment (FIG. 4) and the third embodiment (FIG. 5).

In semiconductor devices 51 and 55, when power semiconductor element 2 is switched on, the main current of power semiconductor element 2 flows from collector electrode 4 (FIG. 2) into the back surface of semiconductor substrate 3, flows in the thickness direction (Z direction) of semiconductor substrate 3, flows out to the front surface of semiconductor substrate 3, and then flows through sub-electrodes 52a to 52d and bonding wires 21 to 29 from the upper side to the lower side in the drawings. Therefore, a voltage drop $\Delta VA$ occurs between the upper end and the lower end of sub-electrode 52a, and a voltage drop $\Delta VB$ occurs between the upper end and the lower end of sub-electrode 52b.

Since sub-electrode 52a is smaller in width than sub-electrode 5a, voltage drop $\Delta VA$ between the upper end and the lower end of sub-electrode 52a is larger than voltage drop $\Delta Va$ between the upper end and the lower end of sub-electrode 5a. Further, since sub-electrode 52b is smaller in width than sub-electrode 5b, voltage drop $\Delta VB$ between the upper end and the lower end of sub-electrode 52b is larger than voltage drop $\Delta Vb$ between the upper end and the lower end of sub-electrode 5b.

The detection value of voltage Vt is larger by $\Delta VB$ when voltage Vt between the upper end of sub-electrode 52a and the lower end of sub-electrode 52b is detected than when voltage Vt between the upper end of sub-electrode 52a and the upper end of sub-electrode 52b is detected. Therefore, in the fourth embodiment, voltage Vt between the upper end of sub-electrode 52a and the lower end of sub-electrode 52b is detected.

As described above, in the fourth embodiment, since the same effect as in the third embodiment can be obtained, sub-electrodes 52a and 52b smaller in width than sub-electrodes 5a and 5b, respectively, are provided, and voltage detector 43 detects voltage Vt between the upper end of sub-electrode 52a and the lower end of sub-electrode 52b, a large voltage Vt can be detected as compared with the first embodiment, and the detection accuracy of temperature T of power semiconductor element 2 can be made higher accordingly.

Note that, in the fourth embodiment, voltage Vt between the upper end of sub-electrode 52a and the lower end of sub-electrode 52b is detected, but the detection method is not limited to such a method. Voltage Vt between a first position, which is separated from one end of sub-electrode 52a by a first distance, and a second position, which is separated from one end of sub-electrode 52b by a second distance different from the first distance, may be detected.

Fifth Embodiment

Figure 7:
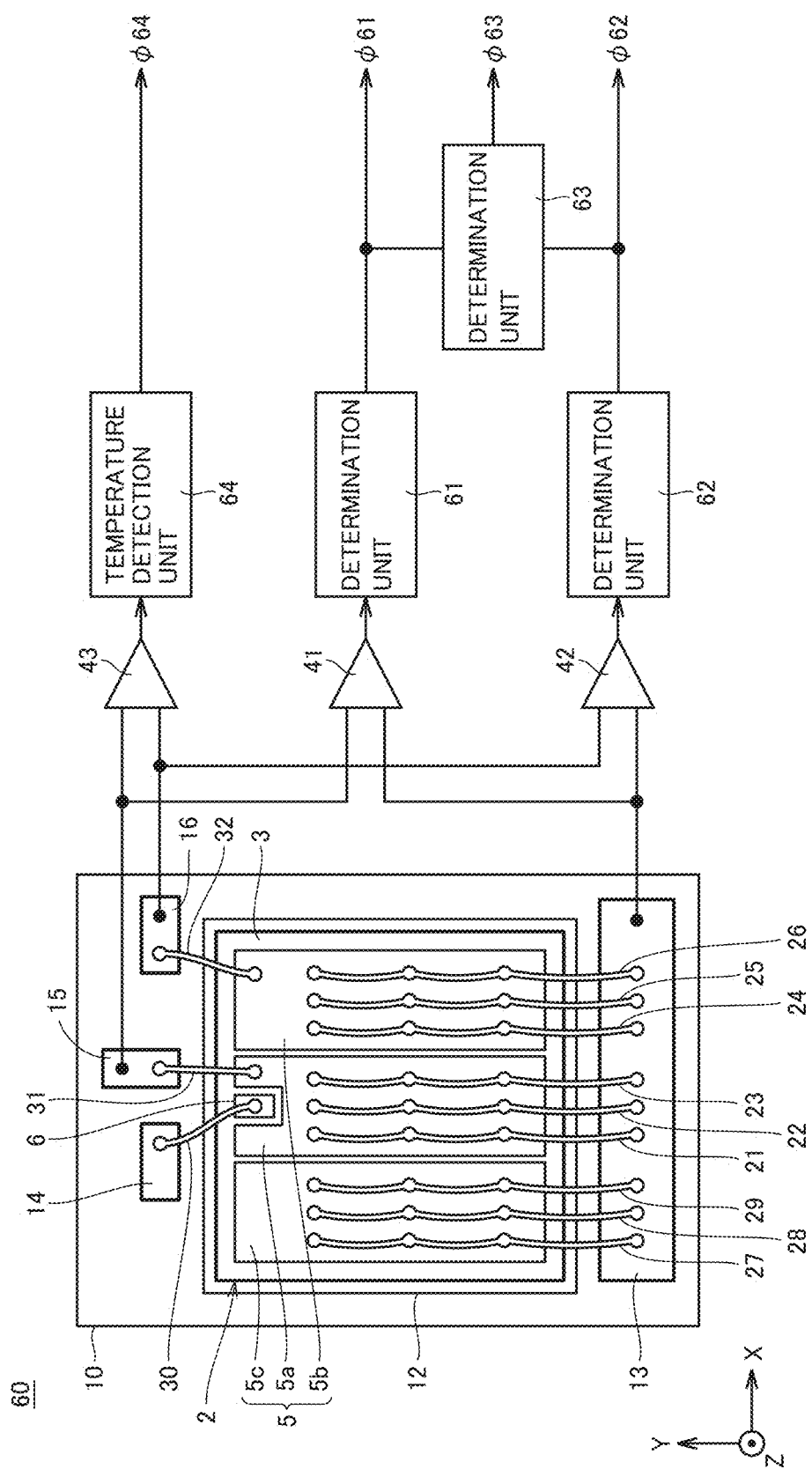
FIG. 7 is a diagram illustrating a configuration of a semiconductor device according to a fifth embodiment.

FIG. 7 is a diagram illustrating a configuration of a semiconductor device 60 according to the fifth embodiment and is a diagram to be compared with FIG. 1. With reference to FIG. 7, semiconductor device 60 is different from semiconductor device 1 (FIG. 1) in that determination units 61 to 63 and a temperature detection unit 64 are additionally provided.

Determination unit 61 determines, on the basis of output signal $\varphi41$ of voltage detector 41, the degree of degradation of bonding wires 21 to 23 that degrade in an early period, and outputs a signal $\varphi61$ indicating the determination result. Determination unit 61 determines that the degree of degradation of bonding wires 21 to 23 is higher as voltage Va indicated by output signal $\varphi41$ of voltage detector 41 is higher.

Determination unit 62 determines, on the basis of output signal $\varphi42$ of voltage detector 42, the degree of degradation of bonding wires 24 to 26 that degrade in a terminal period, and outputs a signal $\varphi62$ indicating the determination result. Determination unit 62 determines that the degree of degradation of bonding wires 24 to 26 is higher as voltage Vb indicated by output signal $\varphi42$ of voltage detector 42 is higher.

Determination unit 63 determines, on the basis of output signals $\varphi61$, $\varphi62$ of determination units 61 and 62 the degree of degradation of entire semiconductor device 60, and outputs a signal $\varphi63$ indicating the determination result. For example, determination unit 63 adds up the degree of degradation of bonding wires 21 to 23 indicated by output signal $\varphi61$ of determination unit 61 and the degree of degradation of bonding wires 24 to 26 indicated by output signal $\varphi62$ of determination unit 62 to obtain the degree of degradation of entire semiconductor device 60. Temperature detection unit 64 detects temperature T of power semiconductor element 2 on the basis of output signal $\varphi43$ of voltage detector 43, and outputs a signal $\varphi64$ indicating the detection value.

As described above, according to the fifth embodiment, it is possible to detect, on the basis of output signals $\varphi61$ to $\varphi64$ of semiconductor device 60, the degree of degradation of bonding wires 21 to 23 that degrade in an early period, the degree of degradation of bonding wires 24 to 26 that degrade in a terminal period, the degree of degradation of entire semiconductor device 60, and temperature T of power semiconductor element 2.

Note that semiconductor device 60 may be regarded in its entirety as a power module, or only base plate 10 and components mounted on base plate 10 of semiconductor device 60 may be regarded as a power module, and voltage detectors 41 to 43, determination units 61 to 63, and temperature detection unit 64 may be provided outside the power module.

Sixth Embodiment

Figure 8:
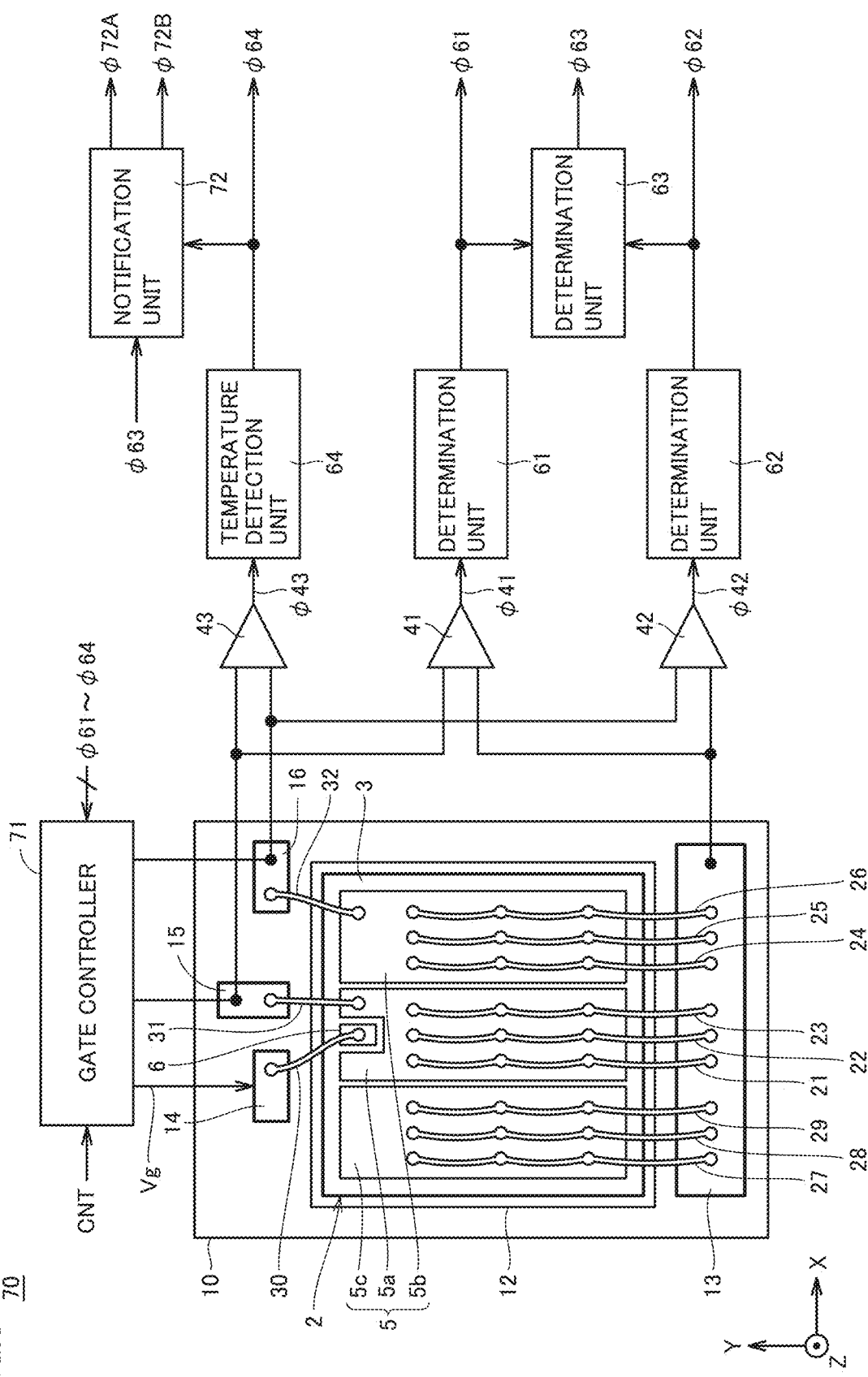
FIG. 8 is a diagram illustrating a configuration of a semiconductor device according to a sixth embodiment.

FIG. 8 is a diagram illustrating a configuration of a semiconductor device 70 according to the sixth embodiment and is a diagram to be compared with FIG. 7. With reference to FIG. 8, semiconductor device 70 is different from semiconductor device 60 (FIG. 7) in that a gate controller 71 and a notification unit 72 are additionally provided.

Gate controller 71 applies a gate voltage Vg between gate terminal 14 and monitor terminal 15 (or monitor terminal 16) on the basis of output signals $\varphi61$ to $\varphi63$ of determination units 61 to 63, output signal $\varphi64$ of temperature detection unit 64, and an external control signal CNT.

External control signal CNT is, for example, a pulse width modulation (PWM) signal that is alternately switched between "H" level and "L" level. Basically, when external control signal CNT is set at "L" level, gate voltage Vg is set at 0 V to switch power semiconductor element 2 off. Further, when external control signal CNT is set at "H" level, gate voltage Vg is set at 15 V to switch power semiconductor element 2 on.

When the degree of degradation of bonding wires 21 to 23 indicated by output signal φ61 of determination unit 61 is low, gate controller 71 applies gate voltage Vg between gate terminal 14 and monitor terminal 15. When the degree of degradation of bonding wires 21 to 23 indicated by output signal φ61 of determination unit 61 is high, gate controller 71 applies gate voltage Vg between gate terminal 14 and monitor terminal 16.

Further, when the degree of degradation of semiconductor device 70 indicated by output signal φ63 of determination unit 63 reaches a maximum value, gate controller 71 determines that semiconductor device 70 has reached the end of its life, and fixes gate voltage Vg at 0 V to keep power semiconductor element 2 in the OFF state.

Further, regardless of output signals φ61 to φ63 of determination units 61 to 63, when temperature T of power semiconductor element 2 indicated by output signal φ64 of temperature detection unit 64 exceeds a first upper limit temperature, gate controller 71 determines either that the performance of the cooler for cooling power semiconductor element 2 has degraded or that a load current has exceeded an upper limit value, and fixes gate voltage Vg at 0 V to keep power semiconductor element 2 in the OFF state.

When the degree of degradation of semiconductor device 70 indicated by output signal φ63 of determination unit 63 reaches an upper limit value lower than the above-described maximum value, notification unit 72 determines that semiconductor device 70 is approaching the end of its life and sets a warning signal φ72A at "H" level which is an active level.

Further, when the degree of degradation of semiconductor device 70 indicated by output signal φ63 of determination unit 63 reaches the above-described maximum value, notification unit 72 determines that semiconductor device 70 has reached the end of its life and sets an error signal φ72B at "H" level which is an active level.

When temperature T of power semiconductor element 2 indicated by output signal φ64 of temperature detection unit 64 has exceeded a second upper limit temperature lower than the first upper limit temperature, notification unit 72 determines either that the performance of the cooler for cooling power semiconductor element 2 has degraded or that the load current has exceeded a rated value, and sets warning signal φ72A at "H" level which is an active level.

Further, when temperature T of power semiconductor element 2 indicated by output signal φ64 of temperature detection unit 64 has exceeded the first upper limit temperature, notification unit 72 determines either that the performance of the cooler for cooling power semiconductor element 2 has degraded or that the load current has exceeded the upper limit value, and sets error signal φ72B at "H" level which is an active level.

As described above, in the sixth embodiment, when semiconductor device 70 has reached the end of its life, and temperature T of power semiconductor element 2 has exceeded the first upper limit temperature, power semiconductor element 2 can be kept in the OFF state. Further, warning signal φ72A and error signal φ72B allow the degree of degradation of semiconductor device 70, degradation of cooling performance, an increase in load current, and the like to be easily detected.

Note that semiconductor device 70 may be regarded in its entirety as a power module, or alternatively, only base plate 10 and components mounted on base plate 10 of semiconductor device 70 may be regarded as a power module and voltage detectors 41 to 43, determination units 61 to 63, temperature detection unit 64, gate controller 71, and notification unit 72 may be provided outside the power module.

Seventh Embodiment

The seventh embodiment corresponds to a power conversion device to which any one of power semiconductor devices 1, 50, 51, 55, 60, and 70 of the first to sixth embodiments is applied. Although the present disclosure is not limited to a specific power conversion device, a case where the present disclosure is applied to a three-phase inverter will be described below as the seventh embodiment.

Figure 9:
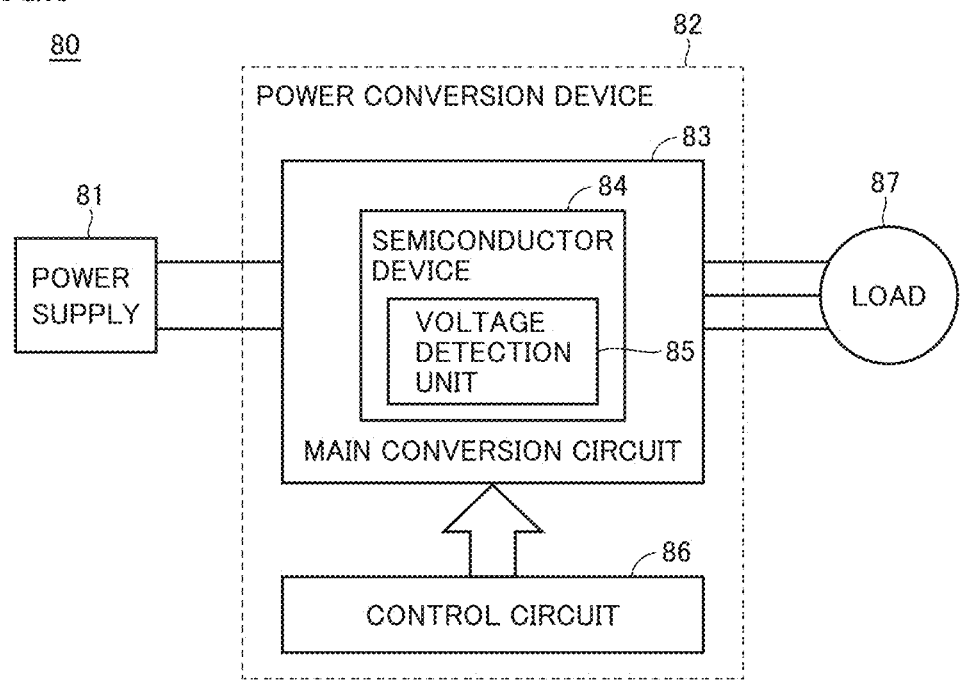
FIG. 9 is a diagram illustrating a configuration of a power conversion system according to a seventh embodiment.

FIG. 9 is a block diagram illustrating a configuration of a power conversion system 80 according to the seventh embodiment. In FIG. 9, power conversion system 80 includes a power supply 81, a power conversion device 82, and a load 87.

Power supply 81 is a DC power supply and supplies DC power to power conversion device 82. Power supply 81 may be made up of any type of component. Power supply 81 may be made up of, for example, a DC system, a solar cell, or a battery. Power supply 81 may be made up of a rectifier circuit connected to an AC system or an AC/DC converter. Further, power supply 81 may be made up of a DC/DC converter that converts DC power output from a DC system into predetermined power.

Power conversion device 82 is a three-phase inverter connected between power supply 81 and load 87. Power conversion device 82 converts DC power supplied from power supply 81 into AC power and supplies the AC power to load 87. Power conversion device 82 includes a main conversion circuit 83 that converts DC power into AC power and outputs the AC power, and a control circuit 86 that outputs, to main conversion circuit 83, a control signal for controlling main conversion circuit 83.

Load 87 is a three-phase electric motor driven by the AC power supplied from power conversion device 82. Load 87 is not limited to a specific application, and is an electric motor mounted on various electric devices. Load 87 is, for example, an electric motor mounted on a hybrid vehicle, an electric vehicle, a railroad car, an elevator, or an air conditioner.

A description will be given below of details of power conversion device 82. Main conversion circuit 83 includes a semiconductor device 84. Semiconductor device 84 includes the components of any one of semiconductor devices 1, 50, 51, 55, 60, and 70 of the first to sixth embodiments. Semiconductor device 84 includes power semiconductor element 2 and a freewheeling diode (not illustrated) connected in antiparallel to each other. When power semiconductor element 2 is switched, DC power supplied from power supply 81 is converted into AC power, and the AC power is supplied to load 87. Semiconductor device 84 includes a voltage detection unit 85. Voltage detection unit 85 includes voltage detectors 41 to 43 (FIG. 1).

Although there are various specific circuit configurations applicable to main conversion circuit 83, main conversion circuit 83 is a two-level three-phase full-bridge circuit in the seventh embodiment. This circuit may be made up of six power semiconductor elements 2 and six freewheeling diodes each antiparallel to a corresponding one of six power semiconductor elements 2. Each two of six power semiconductor elements 2 are connected in series to make up three upper and lower arms. Each upper and lower arms serve as a corresponding phase (U-phase, V-phase, W-phase) of the full-bridge circuit. Output terminals of the upper and lower arms, that is, three output terminals of main conversion circuit 83, are connected to load 87. At least one of six power semiconductor elements 2 is mounted on semiconductor device 84 including the components of any one of semiconductor devices 1, 50, 51, 55, 60, and 70 of the first to sixth embodiments.

Main conversion circuit 83 includes a drive circuit (not illustrated) that drives each power semiconductor element 2. The drive circuit may be contained in semiconductor device 84 or may be separate from semiconductor device 84. The drive circuit generates a drive signal to drive power semiconductor element 2 of main conversion circuit 83 and supplies the drive signal to gate electrode 6 of power semiconductor element 2.

Specifically, the drive circuit outputs, to gate electrode 6 of each power semiconductor element 2, a drive signal to set power semiconductor element 2 into the ON state or the OFF state in accordance with the control signal from control circuit 86. When power semiconductor element 2 is kept in the ON state, the drive signal is a voltage signal greater than or equal to a threshold voltage of power semiconductor element 2 (ON signal). When power semiconductor element 2 is kept in the OFF state, the drive signal is a voltage signal less than or equal to the threshold voltage of power semiconductor element 2 (OFF signal).

Control circuit 86 controls each power semiconductor element 2 of main conversion circuit 83 so as to supply desired power to load 87. Specifically, control circuit 86 calculates a time (ON time) during which each power semiconductor element 2 of main conversion circuit 83 is in the ON state on the basis of the power to be supplied to load 87. For example, control circuit 86 can control main conversion circuit 83 by PWM control under which the ON time of power semiconductor element 2 is modulated in a manner that depends on the voltage to be output.

Control circuit 86 outputs a control command (control signal) to the drive circuit contained in main conversion circuit 83 so as to output the ON signal to power semiconductor element 2 to be in the ON state and output the OFF signal to power semiconductor element 2 to be in the OFF state at each time point. The drive circuit outputs the ON signal or the OFF signal as the drive signal to the gate electrode of power semiconductor element 2 in accordance with the control signal.

Note that semiconductor device 84, in a case of including the components of semiconductor device 70 of the sixth embodiment, eliminates the need of the drive circuit and causes control circuit 86 to output external control signal CNT to gate controller 71.

Further, for example, semiconductor device 84, in a case of including the components of the semiconductor device 1, causes control circuit 86 to detect the degree of degradation of bonding wires 21 to 23 that degrade in an early period, the degree of degradation of bonding wires 24 to 26 that degrade in a terminal period, the degree of degradation of entire semiconductor device 84, and temperature T of power semiconductor element 2, on the basis of output signals φ41 to φ43 of voltage detection unit 85 (voltage detectors 41 to 43) contained in semiconductor device 84.

For example, when the degree of degradation of entire semiconductor device 84 has reached an upper limit value, control circuit 86 outputs a first warning signal for giving a warning that semiconductor device 84 is approaching the end of its life. Further, when the degree of degradation of entire semiconductor device 84 has reached the maximum value higher than the upper limit value, control circuit 86 outputs a first error signal indicating that semiconductor device 84 has reached the end of its life, and keeps power semiconductor element 2 contained in semiconductor device 84 in the OFF state.

Further, when temperature T of power semiconductor element 2 contained in semiconductor device 84 has exceeded the second upper limit temperature, control circuit 86 outputs a second warning signal for giving a warning that temperature T of power semiconductor element 2 is high. Further, when temperature T of power semiconductor element 2 contained in semiconductor device 84 has exceeded the first upper limit temperature higher than the second upper limit temperature, control circuit 86 outputs a second error signal indicating that temperature T of power semiconductor element 2 is too high, and keeps power semiconductor element 2 contained in semiconductor device 84 in the OFF state.

As described above, in the seventh embodiment, main conversion circuit 83 includes semiconductor device 84 including the components of any one of semiconductor devices 1, 50, 51, 55, 60, and 70 of the first to sixth embodiments, so that it is possible to detect the degree of degradation of bonding wires 21 to 23 that degrade in an early period, the degree of degradation of bonding wires 24 to 26 that degrade in a terminal period, the degree of degradation of entire semiconductor device 84, and temperature T of power semiconductor element 2 for each semiconductor device 84.

Note that, in the seventh embodiment, the case where semiconductor device 84 is applied to the two-level three-phase inverter has been described, but the semiconductor device 84 is applicable to not only such a two-level three-phase inverter but also various power conversion devices. In the seventh embodiment, semiconductor device 84 is applied to the two-level power conversion device, but may be applied to a three-level or multi-level power conversion device. Further, in a case where power is supplied to a single-phase load, semiconductor device 84 may be applied to a single-phase inverter. Further, in a case where power is supplied to a DC load or the like, semiconductor device 84 may also be applied to a DC/DC converter or an AC/DC converter.

Further, load 87 connected to power conversion device 82 is not limited to an electric motor. Power conversion device 82 may be used as a power supply device applied to an electric discharge machine, a laser beam machine, an induction heating cooker, or a non-contact power supply system. Alternatively, power conversion device 82 may be used as a power conditioner applied to, for example, a photovoltaic system, or a power storage system.

It should be understood that the embodiments disclosed herein are illustrative in all respects and not restrictive. The scope of the present invention is defined by the claims rather than the above description, and the present invention is intended to include the claims, equivalents of the claims, and all modifications within the scope.

REFERENCE SIGNS LIST 1, 50, 51, 55, 60, 70, 84: semiconductor device, 2: power semiconductor element, 3: semiconductor substrate, 3a to 3c: current source, 4: collector electrode, 5, 52: emitter electrode, 5a to 5c, 52a to 52d: sub-electrode, 6: gate electrode, 10: base plate, 11: insulating layer, 12: collector terminal, 13: emitter terminal, 14: gate terminal, 15, 16: monitor terminal, 21 to 32: bonding wire, 41 to 43: voltage detector, 45, 87: load, 61 to 63: determination unit, 64: temperature detection unit, 71: gate controller, 72: notification unit, 80: power conversion system, 81: power supply, 82: power conversion device, 83: main conversion circuit, 85: voltage detection unit, 86: control circuit

The invention claimed is:

1. A semiconductor device comprising:
a semiconductor element including a semiconductor substrate, a first electrode, a second electrode, and a control electrode, wherein a voltage is applied to the control electrode to cause a current to flow from the first electrode to the second electrode;
a first terminal;
a plurality of bonding wires connecting the second electrode and the first terminal, the second electrode being divided into a plurality of sub-electrodes, the plurality of sub-electrodes including a first sub-electrode provided in a first region including a central portion of a front surface of the semiconductor substrate and a second sub-electrode provided in a second region not including the central portion of the front surface of the semiconductor substrate, the plurality of bonding wires including at least one first bonding wire connecting the first sub-electrode and the first terminal, and at least one second bonding wire connecting the second sub-electrode and the first terminal;
a first voltage detector having a first input that is electrically connected to the first sub-electrode and a second input that is electrically connected to the first terminal, the first voltage detector to detect a voltage difference between the first sub-electrode and the first terminal; and
a second voltage detector having a first input that is electrically connected to the second sub-electrode and a second input that is electrically connected to the first terminal, the second voltage detector to detect a voltage difference between the second sub-electrode and the first terminal.

2. The semiconductor device according to claim 1, further comprising:
second and third terminals;
a third bonding wire connecting the first sub-electrode and the second terminal; and
a fourth bonding wire connecting the second sub-electrode and the third terminal, wherein
the first input of the first voltage detector is electrically connected to the second terminal,
the second input of the first voltage detector is electrically connected to the first terminal,
the first voltage detector detects a voltage difference between the second terminal and the first terminal,
the first input of the second voltage detector is electrically connected to the third terminal,
the second input of the second voltage detector is electrically connected to the first terminal, and
the second voltage detector detects a voltage difference between the third terminal and the first terminal.

3. The semiconductor device according to claim 1, wherein
the plurality of sub-electrodes further includes a third sub-electrode provided in a third region different from the first and second regions of the front surface of the semiconductor substrate,
the plurality of bonding wires further includes a plurality of fifth bonding wires connecting the third sub-electrode and the first terminal,
the first and second sub-electrodes are both smaller in width than the third sub- electrode, and
the at least one first bonding wire and the at least one second bonding wire are both smaller in number than the plurality of fifth bonding wires.

4. The semiconductor device according to claim 3, wherein the number of the at least one first bonding wire is one, and the number of the at least one second bonding wire is one.

5. The semiconductor device according to claim 1, further comprising a third voltage detector having a first input that is electrically connected to the first sub-electrode and a second input that is electrically connected to the second sub-electrode, the third voltage detector to detect a voltage difference between the first sub-electrode and the second sub-electrode.

6. The semiconductor device according to claim 5, further comprising:
second and third terminals;
a third bonding wire connecting the first sub-electrode and the second terminal; and
a fourth bonding wire connecting the second sub-electrode and the third terminal, wherein
the first input of the first voltage detector is electrically connected to the second terminal,
the second input of the first voltage detector is electrically connected to the first terminal,
the first voltage detector detects a voltage difference between the second terminal and the first terminal,
the first input of the second voltage detector is electrically connected to the third terminal,
the second input of the second voltage detector is electrically connected to the first terminal,
the second voltage detector detects a voltage difference between the third terminal and the first terminal,
the first input of the third voltage detector is electrically connected to the second terminal,
the second input of the third voltage detector is electrically connected to the third terminal, and
the third voltage detector detects a voltage difference between the second terminal and the third terminal.

7. The semiconductor device according to claim 5, wherein
a current flows from one end to another end of the first sub-electrode,
a current flows from one end to another end of the second sub-electrode,
the first input of the third voltage detector is electrically connected to a first position on the first sub-electrode,
the second input of the third voltage detector is electrically connected to a second position on the second sub-electrode,
the third voltage detector detects a voltage between the first position on the first sub-electrode and the second position on the second sub-electrode,
the first position on the first sub-electrode is separated from the one end of the first sub-electrode by a first distance, and
the second position on the second sub-electrode separated from the one end of the second sub-electrode by a second distance different from the first distance.

8. The semiconductor device according to claim 5, further comprising a temperature detector to detect a temperature of the semiconductor element on the basis of an output signal of the third voltage detector.

9. The semiconductor device according to claim 1, further comprising:
a first determinator to determine a degree of degradation of the at least one first bonding wire on the basis of a detection result of the first voltage detector; and
a second determinator to determine a degree of degradation of the at least one second bonding wire on the basis of a detection result of the second voltage detector.

10. The semiconductor device according to claim 9, further comprising a third determinator to determine a degree of degradation of the semiconductor device on the basis of determination results of the first and second determinators.

11. A power conversion device comprising:
a main conversion circuit including the semiconductor device according to claim 1, the main conversion circuit converting input power and outputting the converted power; and
a control circuit to output, to the main conversion circuit, a control signal for controlling the main conversion circuit.

12. The power conversion device according to claim 11, wherein the control circuit controls the semiconductor element contained in the semiconductor device on the basis of detection results of the first and second voltage detectors contained in the semiconductor device.

13. The semiconductor device according to claim 1, further comprising:
second and third terminals;
a third bonding wire connecting the first sub-electrode and the second terminal; and
a fourth bonding wire connecting the second sub-electrode and the third terminal, wherein
the first input of the first voltage detector is electrically and physically connected to the second terminal,
the second input of the first voltage detector is electrically and physically connected to the first terminal,
the first voltage detector detects a voltage difference between the second terminal and the first terminal,
the first input of the second voltage detector is electrically and physically connected to the third terminal,
the second input of the second voltage detector is electrically and physically connected to the first terminal, and
the second voltage detector detects a voltage difference between the third terminal and the first terminal.

14. The semiconductor device according to claim 5, further comprising:
second and third terminals;
a third bonding wire connecting the first sub-electrode and the second terminal; and
a fourth bonding wire connecting the second sub-electrode and the third terminal, wherein
the first input of the first voltage detector is electrically and physically connected to the second terminal,
the second input of the first voltage detector is electrically and physically connected to the first terminal,
the first voltage detector detects a voltage difference between the second terminal and the first terminal,
the first input of the second voltage detector is electrically and physically connected to the third terminal,
the second input of the second voltage detector is electrically and physically connected to the first terminal,
the second voltage detector detects a voltage difference between the third terminal and the first terminal,
the first input of the third voltage detector is electrically and physically connected to the second terminal,
the second input of the third voltage detector is electrically and physically connected to the third terminal, and
the third voltage detector detects a voltage difference between the second terminal and the third terminal.

15. The semiconductor device according to claim 6, wherein
a current flows from one end to another end of the first sub-electrode,
a current flows from one end to another end of the second sub-electrode,
the third bonding wire is electrically connected to a first position on the first sub- electrode,
the fourth bonding wire is electrically connected to a second position on the second sub-electrode,
the first input of the third voltage detector is electrically connected to the second terminal,
the second input of the third voltage detector is electrically connected to the third terminal,
the third voltage detector detects a voltage between the first position on the first sub-electrode and the second position on the second sub-electrode,
the first position on the first sub-electrode is separated from the one end of the first sub-electrode by a first distance, and
the second position on the second sub-electrode separated from the one end of the second sub-electrode by a second distance different from the first distance.

16. The semiconductor device according to claim 6, wherein
a current flows from one end to another end of the first sub-electrode,
a current flows from one end to another end of the second sub-electrode,
the third bonding wire is electrically and physically connected to a first position on the first sub-electrode,
the fourth bonding wire is electrically and physically connected to a second position on the second sub-electrode,
the first input of the third voltage detector is electrically and physically connected to the second terminal,
the second input of the third voltage detector is electrically and physically connected to the third terminal,
the third voltage detector detects a voltage between the first position on the first sub-electrode and the second position on the second sub-electrode,
the first position on the first sub-electrode is separated from the one end of the first sub-electrode by a first distance, and
the second position on the second sub-electrode separated from the one end of the second sub-electrode by a second distance different from the first distance.

17. The semiconductor device according to claim 2, wherein the third terminal is disposed closer to the first terminal than the second terminal.

18. The semiconductor device according to claim 2, wherein
the at least one third bonding wire is electrically and physically connected to a first position on the first sub-electrode,
the at least one fourth bonding wire is electrically and physically connected to a second position on the second sub-electrode, and the second position is closer to the first terminal than the first position.

19. The semiconductor device according to claim 2, wherein the at least one first bonding wire is bonded to at least two points on the first sub-electrode, and the at least one second bonding wire is bonded to at least two points on the second sub-electrode.

20. The semiconductor device according to claim 2, wherein the at least one first bonding wire includes at least two first bonding wires, each of the at least two first bonding wires is bonded to at least two points on the first sub-electrode, the at least one second bonding wire includes at least two second bonding wires, and each of the at least two second bonding wires is bonded to at least two points on the second sub-electrode.

* * * * *